(12) United States Patent
Frese

(10) Patent No.: US 11,094,836 B2
(45) Date of Patent: Aug. 17, 2021

(54) CHARGE AVALANCHE PHOTODETECTOR SYSTEM

(71) Applicant: Fraunhofer-Gesellschaft Zur Förderung der angewandten Forschung e.V., Munich (DE)

(72) Inventor: Ines Frese, Mainz (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 107 days.

(21) Appl. No.: 16/342,029

(22) PCT Filed: Oct. 13, 2017

(86) PCT No.: PCT/EP2017/076168
§ 371 (c)(1),
(2) Date: Apr. 15, 2019

(87) PCT Pub. No.: WO2018/073112
PCT Pub. Date: Apr. 26, 2018

(65) Prior Publication Data
US 2019/0252558 A1 Aug. 15, 2019

(30) Foreign Application Priority Data
Oct. 19, 2016 (DE) ...................... 10 2016 220 492.0

(51) Int. Cl.
*H01L 31/02* (2006.01)
*G01N 21/76* (2006.01)
(Continued)

(52) U.S. Cl.
CPC ..... *H01L 31/02027* (2013.01); *G01N 21/763* (2013.01); *H01L 27/1443* (2013.01); *H01L 31/024* (2013.01); *G01N 21/76* (2013.01)

(58) Field of Classification Search
CPC ......... H01L 31/02027; H01L 31/02019; H01L 31/02016; H01L 31/02; H01L 31/024;
(Continued)

(56) References Cited

U.S. PATENT DOCUMENTS

| | | | | |
|---|---|---|---|---|
| 5,917,639 A * | 6/1999 | Ushirozawa | ....... | H04B 10/6931 250/201.1 |
| 6,821,808 B2 * | 11/2004 | Nakamura | ......... | H04N 5/35518 438/57 |

(Continued)

FOREIGN PATENT DOCUMENTS

| | | |
|---|---|---|
| DE | 10 2014 119 300 A1 | 6/2016 |
| EP | 2 293 032 A1 | 3/2011 |
| WO | WO 2015/077614 A1 | 5/2015 |

OTHER PUBLICATIONS

International Search Report, issued in International Application No. PCT/EP2017/076168, dated Jan. 22, 2018, pp. 1-6, European Patent Office, Rijswijk, Netherlands.

(Continued)

*Primary Examiner* — John R Lee
(74) *Attorney, Agent, or Firm* — Crowell & Moring

(57) ABSTRACT

A charge avalanche photodetector system (CAPD system) is provided comprising a charge avalanche photodetector based on the charge avalanche principle and amplifier electronics, where the amplifier electronics are electrically connected downstream of the charge avalanche photodetector, with the charge avalanche photodetector being able to be selectively operated with a voltage bias $V_{bias}$ or without the voltage bias $V_{bias}$.

16 Claims, 5 Drawing Sheets

(51) Int. Cl.
   *H01L 27/144* (2006.01)
   *H01L 31/024* (2014.01)
(58) Field of Classification Search
   CPC ... H01L 27/1443; G01N 21/76; G01N 21/763
   See application file for complete search history.

(56) References Cited

U.S. PATENT DOCUMENTS

| | | | | |
|---|---|---|---|---|
| 6,894,266 | B2* | 5/2005 | Richard | H03K 19/00369 250/214 LA |
| 6,909,267 | B2* | 6/2005 | Alexander | H02M 3/155 323/284 |
| 7,485,838 | B2* | 2/2009 | Nishi | G01J 1/44 250/214 A |
| 7,897,906 | B2* | 3/2011 | Deschamps | H03K 17/78 250/214 R |
| 8,017,900 | B2* | 9/2011 | Mathewson | G01J 1/46 250/214 R |
| 8,049,157 | B2* | 11/2011 | Nishi | G01J 1/44 250/214 A |
| 8,466,405 | B2* | 6/2013 | Bach | H01L 31/02019 250/214 R |
| 9,997,644 | B2* | 6/2018 | Zarkesh-Ha | H01L 31/0304 |
| 2001/0020673 | A1* | 9/2001 | Zappa | G01J 1/44 250/214 R |
| 2002/0024058 | A1* | 2/2002 | Marshall | H04N 5/3745 257/170 |
| 2002/0153949 | A1* | 10/2002 | Yoon | H03F 3/082 330/69 |
| 2003/0214353 | A1* | 11/2003 | Yoon | H03F 3/082 330/69 |
| 2005/0205759 | A1* | 9/2005 | Wang | H01L 31/02027 250/214.1 |
| 2006/0027736 | A1* | 2/2006 | Ichino | H01L 31/02027 250/214 R |
| 2006/0202766 | A1* | 9/2006 | Kwa | H03G 1/0029 330/308 |
| 2006/0255245 | A1* | 11/2006 | Ichino | H01L 31/02027 250/214 R |
| 2007/0045672 | A1* | 3/2007 | Nishi | H04N 5/2351 257/257 |
| 2008/0290259 | A1* | 11/2008 | Mathewson | G01J 1/46 250/214 R |
| 2009/0121119 | A1* | 5/2009 | Nishi | H01L 31/102 250/214 LS |
| 2011/0062315 | A1* | 3/2011 | Bach | H01L 31/02019 250/214 R |
| 2011/0062543 | A1* | 3/2011 | Nishi | H04N 5/2351 257/461 |
| 2013/0071106 | A1* | 3/2013 | Tsunoda | H01L 31/02027 398/25 |
| 2013/0221193 | A1* | 8/2013 | Williams | H01L 31/02027 250/206 |
| 2013/0221221 | A1* | 8/2013 | Bouzid | G01J 1/44 250/338.4 |
| 2013/0334411 | A1* | 12/2013 | Brunel | H01L 31/02019 250/252.1 |
| 2014/0191115 | A1* | 7/2014 | Webster | H01L 27/14609 250/214 R |
| 2014/0291487 | A1* | 10/2014 | Laforce | H01L 31/02016 250/214 LA |
| 2015/0145597 | A1* | 5/2015 | Huang | H03F 1/086 330/260 |
| 2015/0285625 | A1 | 10/2015 | Deane | |
| 2016/0025777 | A1* | 1/2016 | Deliwala | A61B 5/02427 324/115 |
| 2016/0072453 | A1* | 3/2016 | Mohan | H01L 31/02019 250/208.2 |
| 2016/0163886 | A1* | 6/2016 | Wang | G01J 1/44 250/214.1 |
| 2016/0181459 | A1 | 6/2016 | Birk et al. | |
| 2016/0254407 | A1* | 9/2016 | Wang | H01L 31/075 136/256 |
| 2016/0284878 | A1* | 9/2016 | Zarkesh-Ha | H01L 31/107 |
| 2017/0108376 | A1* | 4/2017 | Maryfield | F41G 1/38 |
| 2017/0131143 | A1* | 5/2017 | Andreou | H01L 31/02027 |
| 2017/0338780 | A1* | 11/2017 | Bajwa | H04B 10/503 |
| 2017/0363467 | A1* | 12/2017 | Clemens | G01J 1/46 |
| 2018/0120152 | A1* | 5/2018 | Leonardo | H01L 27/1446 |
| 2018/0164152 | A1* | 6/2018 | Scott | G01J 1/44 |
| 2018/0234096 | A1* | 8/2018 | Li | H03F 3/082 |
| 2019/0137636 | A1* | 5/2019 | Frach | G01T 7/005 |
| 2019/0252558 | A1* | 8/2019 | Frese | G01N 21/763 |
| 2020/0235822 | A1* | 7/2020 | Yoshima | H04B 10/69 |

OTHER PUBLICATIONS

BeiJu Huang et al., "A monolithic optical receiver chip for free space visible light communication system," ISBN 978-1-4673-2475-5, 2012 IEEE 11th International Conference on Solid-State and Integrated Circuit Technology, dated Feb. 21, 2013, pp. 1-3, published online by IEEE at URL https://doi.org/10.1109/ICSICT.2012.6467906.

P. Eraerds et al., "SiPM for fast Photon-Counting and Multiphoton Detection," Optics Express, dated Oct. 19, 2017, pp. 1-11, vol. 15, No. 22, published by Optical Society of America, Geneva, Switzerland.

Konrad Briggl, "KLAus und STic—Zwei ASICs zur präzisen Energie- und Zeitmessung," dated Oct. 2012, pp. 1-117, published by Heidelberg University, Heidelberg, Germany.

Holger Göbel, "Parallel-Parallel-Rückkopplung (Transimpedanzerstärke)," Einführung in die Halbleiter-Schaltungstechnik, 6$^{th}$ Edition, Chapter 10, dated Jan. 14, 2019, pp. 290-298, published by Springer Vieweg, New York City, New York.

* cited by examiner

CHARGE AVALANCHE PHOTODETECTOR SYSTEM

CROSS-REFERENCE TO RELATED APPLICATIONS

This application is a 371 nationalization of international patent application PCT/EP2017/076168 filed Oct. 13, 2017, which claims priority under 35 USC § 119 to German patent application DE 10 2016 220 492.0 filed Oct. 19, 2016. The entire contents of each of the above-identified applications are hereby incorporated by reference.

TECHNICAL FIELD

The present invention relates to a charge avalanche photodetector system (abbreviated to CAPDS in the following) having a charge avalanche photodetector based on the charge avalanche principle (preferably a semiconductor photomultiplier or an avalanche photodiode and/or preferably having intrinsic gain) and having amplifier electronics electrically connected downstream of the charge avalanche photodetector.

DETAILED DESCRIPTION

Figure 1:
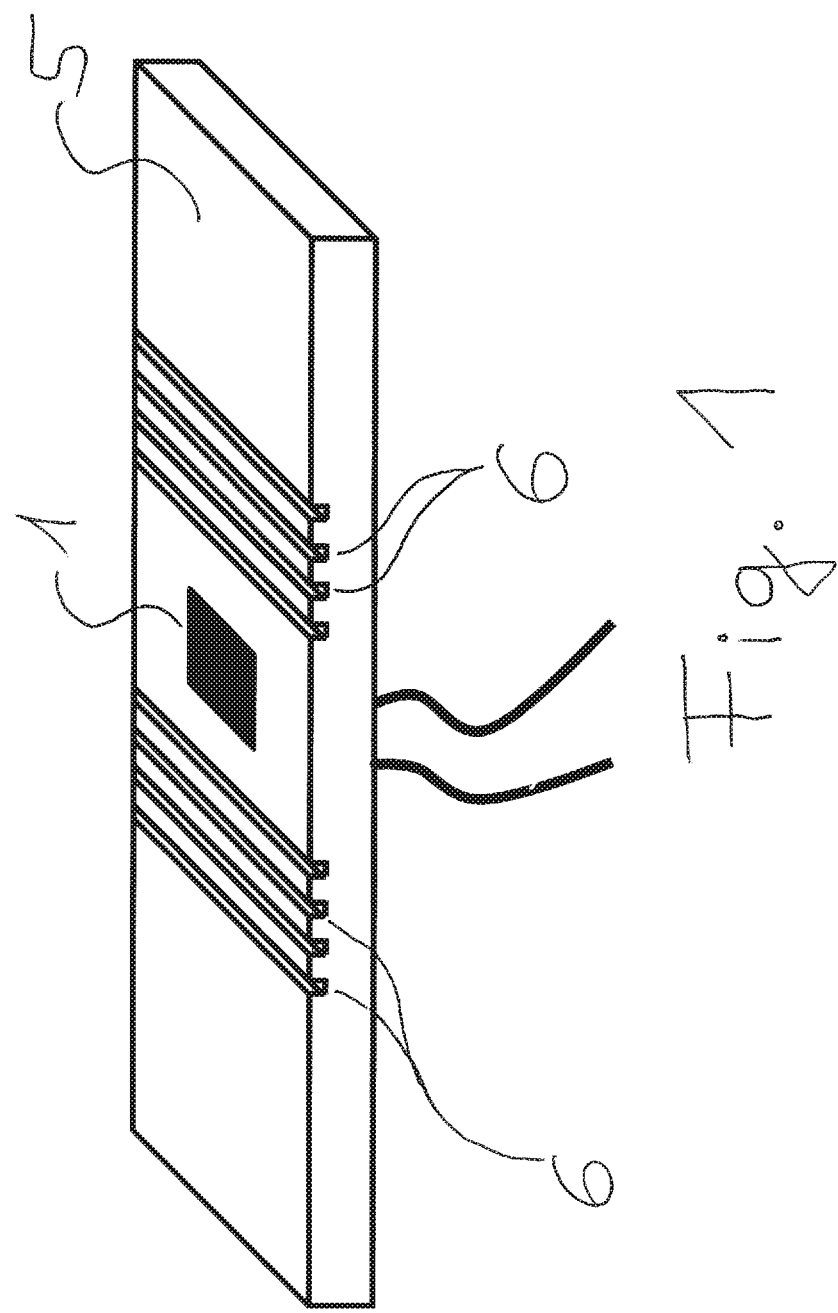
FIG. 1 illustrates an SiPM module in accordance with the invention for measurements of chemiluminescence and absorption.

In the following, the invention will primarily be described using the example of a semiconductor photomultiplier as a charge avalanche photodetector. This is, however, not restrictive, i.e. in accordance with the invention, an avalanche photodiode can also always be used (where not stated otherwise) as the charge avalanche photodetector instead of such a semiconductor photomultipier.

The selection of an optical detector depends on the intensity of the light signal to be expected in the system. With stronger signals (for example when irradiating an LED with optical power in the milliwatt range—for example for transmission measurements), the sensitivity of a PIN photodiode (positive intrinsic negative diode), in which a single photon only generates one single electron on impact with the detector surface, is sufficient. With considerably weaker signals, for example in the range of 10 nW to 50 pW, an additional amplification of the signal is required, either by intrinsic gain in the detector or by a post-amplification of the signal after the detector by means of amplifier electronics connected downstream. This can take place, for example, by triggering an electron avalanche in an avalanche photodiode (abbreviated in the following: APD) or in a photomultiplier (abbreviated in the following: PMT) having an amplification factor of up to $10^5$, or with the aid of electronics connected downstream.

Electronic amplification, however, also brings along a disadvantage: the dark noise is also amplified and the detection limit is impaired. In the measuring range below 50 pW, the photon detection can take place in the so-called digital mode (Geiger mode) and requires a total gain of $>10^6$, which can, however, only be achieved with a high-quality PMT or with silicon photomultipliers (abbreviated to SiPM below) and may require additional cooling of the detector under certain circumstances. Chemiluminescence signals from a biofunctionalized surface also fall within this signal range, for example. This means that a plurality of detectors are required to detect strong signals and weak signals with one device, that is, a plurality of detectors have to be combined.

For automated devices with high throughputs, this means an additional effort regarding sample transport between a plurality of single detectors and regarding measures for the light protection of the photomultiplier.

In summary, different detectors are used for different intensities in the prior art. Si photodetectors or GaAs photodetectors (PIN diodes) are used for higher optical signal levels and silicon photomultipliers based on avalanche technology are used for lower signal levels.

Starting from the prior art, it is the object of the present invention to provide a charge avalanche photodetector system that enables the use of a plurality of measurement methods with variable (incident) light intensity. The system is intended to provide a dynamic range for the detection that is as wide as possible. In addition, the system should not be too expensive.

This object is satisfied by, for example, a charge avalanche photodetector system, comprising: a charge avalanche photodetector based on the charge avalanche principle, preferably a semiconductor photomultiplier or an avalanche photodiode; and amplifier electronics electrically connected downstream of the charge avalanche photodetector, wherein the charge avalanche photodetector is selectively operable with a bias voltage $V_{bias}$ or without such a bias voltage $V_{bias}$.

The present invention starts from the basic idea that, currently, silicon photomultipliers for single photon detection are only operated in Geiger counter mode. Applications are, for example, positron emission tomography and single photon emission computer tomography or also the detection of weak fluorescence signals. The intrinsic gain of a SiPM or of an APD is, however, alone not sufficient for the detection of the weak chemiluminescence signals. The present invention now expands the area of use in that inter alia both the dynamic range of a charge avalanche photodetector, CAPD, is expanded in the direction of the weak chemiluminescence signals and a use is made possible in the charge integration mode (in the following: CI mode) that is required for higher photon streams. As part of the system in accordance with the invention, a silicon photomultiplier is in particular used as the charge avalanche photodetector. As a rule, silicon photomultipliers consist of or comprise arrays of avalanche photodiodes connected in parallel ("pixels" or "microcells") having, as a rule, an effective area between 10 and 100 μm² that are operated in the prior art with a negative voltage bias, above the breakdown voltage bias, in the Geiger counter mode (in the following: Geiger mode). They offer the advantage, in addition to a geometrical efficiency of 65 to 70%, of a very small construction size and a gain of approximately $10^7$. The basic design of the charge avalanche principle detector of the present invention can follow this construction principle. The construction principle per se is familiar to the skilled person; see, for example ERAERDS, Patrick, et al. "SPM for fast photon-counting and multiphoton detection", Optics Express, 2007, 15th Vol., No. 22, pp 14539-14549.

A major feature of the present invention is now that the charge avalanche photodetector cannot, as in the prior art, only be operated always with a voltage bias (intrinsic gain), but that the charge avalanche photodetector can be operated in accordance with the invention selectively either with such a voltage bias or without such a voltage bias (in other words: completely without voltage bias). It is understood by this in accordance with the invention that the charge avalanche photodetector is suitable or is configured to be operated either with such a voltage bias or without such a voltage bias.

Features which describe the operation of the charge avalanche photodetector system and/or the operation of its components (method features) are understood as features for whose implementation the charge avalanche photodetector system and/or its components is/are suitable or configured.

The charge avalanche photodetector can, for example, work without negative voltage bias in accordance with the invention so that the detector can operate as a standard PIN diode array having low dark noise corresponding to the pixel size and having a sensitivity that can correspond to a Si PIN diode. If the amplifier electronics electrically connected downstream of the charge avalanche photodetector (that is, the amplifier electronics electrically connected to the charge avalanche photodetector) is switched on (or is it amplifying), the sensitivity range between the mode of a PIN photodiode and the Geiger counter mode can be covered. In addition, work can also be carried out with a voltage bias in the Geiger counter mode: It is thus possible in accordance with the invention to implement a universal detector having a dynamic range of up to 10 decades on the basis of a charge avalanche photodetector (in particular: silicon photomultiplier).

The following abbreviations are used for the description of the invention in the following:
  Charge avalanche photodetector system=CAPDS or CAPD system
  Charge avalanche photodetector=CAPD (preferred variant: silicon photomultiplier=SiPM)
  Amplifier electronics=AE
  Voltage bias or operating voltage bias or bias voltage=$V_{bias}$ The CAPDS in accordance with the invention can be implemented in avalanche technology or can be designed on the basis of the avalanche principle. The (operating) voltage bias $V_{bias}$ is alternatively also called bias voltage. This bias voltage is as a rule a negative voltage bias with which the individual CAPD or the individual avalanche photodiodes of the array are operated by parallelly connected avalanche photodiodes of the CAPD connected in parallel. The design and operation of such a CAPD is generally familiar to the skilled person, e.g. Chapter "1.2 Photodetektoren mit Lawineneffekt-Siliziumphotomultiplier" in the diploma thesis "KLAuS and STiC—Zwei ASICS zur präzisen Energie- und Zeitmessung" by Konrad Briggl, Heidelberg University, October 2012.

In operation with a bias voltage $V_{bias}$, in accordance with the invention, as a rule, it is set as regards its amount to a value greater than the breakdown voltage $V_{break}$. In other words, when $V_{bias} \neq 0$ (that is, the CAPDS is currently operated with a voltage bias), the CAPDS is, as a rule, used in a similar manner to an amplified PIN diode. When $V_{bias}$ $V_{bias, max}$, the CAPDS changes into Geiger mode (for single photon detection or in charge counting mode), $V_{bias} > V_{break}$ therefore applies.

Advantageously implementable features can include a switchover from operation with a bias voltage $V_{bias}$ to operation without such a bias voltage $V_{bias}$, or vice versa, takes place by means of the amplifier electronics, preferably by means of control electronics integrated in the amplifier electronics The CAPD system or its AE can therefore have a means by means of which the bias voltage $V_{bias}$ applied at the CAPD or at the individual avalanche photodiodes of the array of the HPLM is changeable between different (negative) voltage values and the value $V_{break}$ ($V_{bias} \leq V_{break}$ equal to the value 0: the voltage bias that does not trigger any intrinsic gain).

This means can, for example, be a software-based circuit. For example, a user interface can be generated or applied in which, for example, corresponding buttons can be clicked on a mouse basis. The $V_{bias}$ applied to the CAPD or to the individual avalanche photodiodes of the array of the HPLM can be changed between the different voltage values or the value 0 by this clicking.

An event-based circuit is equally conceivable as the means: A measurement can be carried out, for example, from the lowest sensitivity in the direction of the highest sensitivity and, on the first occurrence of measurement signals (as the triggering event), the matching range can be selected.

In accordance with the invention, the circuit for changing the $V_{bias}$ can therefore be integrated in the AE. A corresponding control program can be based on LabView (different kinds of control programs are also conceivable, however). The circuit for the change or the control program can control all the measurement procedures, including the switchover. The circuit for the change or the control program can make it possible by clicking on specific selection boxes (that are, for example, marked with "Chemiluminescence" or "Absorbance/Absorption") to select and to activate the program corresponding to the respective selection box and having programmed settings for "With/Without voltage bias" and/or "With/Without electrical gain" (that is, for example, to select a program in which the CAPD is operated with $V_{bias}$ and in which the AE is switched on, that is, in turn likewise amplifies).

Alternatively to this, it is, however, also possible in accordance with the invention to use a separate circuit, that is, a circuit not belonging to the AE or integrated in the AE, that is configured to switch over from operation with a $V_{bias}$ to operation without such a $V_{bias}$, or vice versa.

Further advantageously implementable features can include the CAPD system being operable, both in operation of the charge avalanche photodetector with a bias voltage $V_{bias}$ and in operation of the charge avalanche photodetector without such a bias voltage $V_{bias}$, selectively either with the amplifier electronics switched on or with the amplifier electronics switched off Within the framework of the claim structure, all the individual features of the present invention can also be implemented in a different manner than described in the following. Individual features from the following embodiment can thus, for example, be added or omitted.

Each of the two modes (operation of the CAPD with voltage bias or without voltage bias) can therefore be combined with the amplification electronics (corresponding mode with AE switched on) or also not (corresponding mode with AE switched off). A switching on of the AE means that it works with an amplification factor (also abbreviated to "AF" in the following), that therefore AF>1 applies, and that the AE therefore carries out a (real) signal gain. A switching off of the AE means that it does not amplify the signal supplied from the CAPD (that is, the signal detected by the CAPD), that is, its signal strength remains unchanged. The AE can here have a plurality of different gain stages that, for example, make possible amplification factors as follows: $1<AF<7.5*10^7$ (total gain of the AE).

In accordance with the invention, a selection of amplification factors or of amplification levels can be stored in the AE (or in a/the separate circuit, that is the circuit not belonging to the AE). Amplification factors can, for example, be determined as part of pre-tests. On a software basis (for example via a/the control program based on LabView), defined combinations (of a AF and a voltage bias respectively) can be associated with defined measurement methods (for example "chemiluminescence" or "absorbance"). A specific combination of AF and $V_{bias}$ can be or is set by the selection of such a measurement method.

In accordance with the invention, however, a different scenario is also possible in which a program automatically selects a combination corresponding to a signal level to be measured on a software base as part of a pre-test (for example based on the lowest signal-to-noise ratio). This combination can then be saved, that is, stored in the CAPDS) as a new (for example, customized) measurement method.

For this purpose or very generally, the CAPDS in accordance with the invention can be implemented or can work with computer assistance, that is, comprise a suitable computer system (for example, a personal computer PC or a server) together with a microprocessor and a program memory for storing or saving a control program (or a plurality of control programs) and/or one or more measurement methods.

Further advantageously implementable features can include the charge avalanche photodetector being switchable between the Geiger mode, a charge integration mode, and/or a mode of a PIN photodiode Said modes per se are generally familiar to the skilled person, cf. for example "Chapter 1. Introduction" in the already mentioned diploma thesis "KLAuS und STiC— Zwei ASICs zur präzisen Energie-und Zeitmessung".

At low signal intensities of the incident light or with a small number of photons (for example chemiluminescence or bioluminescence) incident per unit of area and time, the CAPD can thus be operated in Geiger mode. At higher and high signal intensities of the incident light or with a higher or high number of photons incident per unit of area and time (for example fluorescence measurement and/or absorbance measurement of low-concentration or high-concentration analytes), the CAPD can thus be operated in the charge integration mode.

In accordance with the invention, for example, a change can be made between the Geiger mode and the charge integration mode (CI mode) in that for the charge integration $V_{bias}>V_{break}$ is set according to amount and $V_{bias} \rightarrow V_{bias, max.}$ is set according to amount for the Geiger mode. In accordance with the invention, the Geiger mode based on an intrinsic gain can be expanded by a combination with a/the electronic amplification with low background noise in the direction of even weaker signals.

The electronic amplification AE in accordance with the invention can be a multi-stage gain with a zero adjustment before the last gain stage. Individual gains can be fixed specific to the method. A universal platform for the implementation of a measurement system is thus provided in accordance with the invention. The measurement system can be implemented for all imaginable combinations of optical measurement methods with customized demands.

In accordance with the invention, for example, a switchover into the Geiger mode can simply take place manually if it is found, after observing measurement values displayed at the monitor of the CAPDS, that the number or the intensity is too low for the chare integration mode.

The chemical analysis kit can determine which measurement method or which mode is actually being used. The chemistry for the sample preparation is typically designed for the measurement with a specific method (absorption, fluorescence, or chemiluminescence). The CAPDS can therefore be designed for a specific spectrum of chemical analysis kits; the measurement methods to be used are thereby predefined. (Different devices in different price classes exist in the prior art in dependence on the number of measurement methods and on the breadth of the licensed analysis kits. The requirement of the installation of a plurality of detectors in particular leads to a considerable increase in price in the universal devices of the prior art for plurality of measurement methods. The detector described here or the CAPDS described here solves this problem.)

The gains of individual gain stages to be fixed for specific combinations of the measurement methods can be determined (differently for each measurement method) in accordance with the invention as part of pre-tests (e.g. determining the minimum and/or maximum of the intensities to be expected or measured) can therefore be determined using signal intensities to be expected. Fixed gains corresponding to the specific measurement method can be set manually on a software basis during the tests.

It is, however, also conceivable in accordance with the invention to expand the software by a mode selection subroutine that determines the ideal gain for the individual gain stages in an automated pre-test based on the maximum and minimum measurable signal strength in a specific measurement method. In the operation of the CAPD system, a corresponding measurement method having the associated gain can here be automatically associated with the analysis kit (or can be activated in the device) (for example by reading a barcode).

Further advantageously implementable features can include the CAPD system being operable in the following measurement modes, that is, the CAPD system can be switched over from any one desired measurement mode to any other one of the measurement modes listed below or can at least be switched over between respective directly adjacent measurement modes in accordance with the following order:

Total gain mode 0: Operating the charge avalanche photodetector (1) without a bias voltage $V_{bias}$ and with the amplifier electronics (2) switched off.

Total gain mode 1: Operating the charge avalanche photodetector (1) without a bias voltage $V_{bias}$ and with the amplifier electronics (2) switched on.

Total gain mode 2: Operating the charge avalanche photodetector (1) with a bias voltage $V_{bias}$ and with the amplifier electronics (2) switched off.

Total gain mode 3: Operating the charge avalanche photodetector (1) with a bias voltage $V_{bias}$ and with the amplifier electronics (2) switched on.

The term of gain mode is also used as part of the invention alternatively to the term of total gain mode or measurement mode.

The total gain mode 0 is comparable with a PIN photodiode. The total gain mode 1 is comparable with an amplified PIN photodiode. The total gain mode 2 is comparable with a CAPD having a voltage bias or with a commercial PMT (photomultiplier tube). With the total gain modes 1 and 2 being able to overlap. The total gain mode 3 is comparable with a cooled photomultiplier having a voltage bias.

Which of said four total gain modes is actually being used can be determined in that a switchover is carried out manually if it is found, for example after observing the measurement values displayed on the screen, that the incident number or intensity of photons is not suitable for the actually selected mode. In the CAPDS in accordance with the invention, the measurement signal can be read after every gain stage and can, for example, be displayed on the screen by LabView. The matching mode can thereby be selected from the existing modes, can be assigned to a measurement method and can be stored in the CAPDS for the measurement of the analysis kits.

If a measurement signal is, for example, at the top or bottom of the stop, the user knows that the actually set measurement mode is not suitable. The required dynamic measurement range is typically explored in a test (pre-test) for a specific analysis kit. Error signals here indicate incorrectly run chemical reactions and thus the necessity of repeating the test.

As described, however, it is also possible to switch over automatically (for example on a software basis).

The embodiment with these four possible total gain modes in particular provides the advantage that the CAPDS in accordance with the invention (that is: that exactly one detector system) is universally suitable for the measurement of both optical chemiluminescence signals (preferred: in total gain mode 3, in particular with the CAPD in Geiger mode and with maximum intrinsic and electronic gain of the AE switched on) and optical fluorescence signals (preferred: in total gain mode 1 or in total gain mode 2, optionally also in total gain mode 3 with, as a rule, small gain of the AE switched on, and optical absorption signals (preferred: in total gain mode 0 or in total gain mode 1).

Measurements with almost any desired optical signal intensity are thus possible. The invention thus makes it possible that a plurality of different optical detectors or photodetectors are no longer required in the system to detect both weak and strong optical signals.

In accordance with the invention, not only the visible spectral range between approximately 380 nm and 750 nm can be detected or scanned by the CAPDS, but the following wavelength ranges can also be detected or measured, for example:
SiPM without a protective layer: From 200 nm upward.
SiPM with a polymer protective layer: Approx. 350 nm to 900 nm.
InGaAs-avalanche photodiode: Approx. 0.9 µm to 1.7 µm.

Further advantageously implementable features can include the charge avalanche photodetector being or comprising a silicon photomultiplier, SiPM.

In general, however, a Ge avalanche photodiode (Ge APD) or an InGaAs APD can also be used as the CAPD within the framework of the invention.

Further features in accordance with the invention that can include the amplifier electronics being or comprising a, preferably multi-stage, particularly preferably three-stage, transimpedance amplifier.

See also the following embodiment in this respect.

The maximum gain of such a three-stage transimpedance amplifier can e.g. amount to $3.75*10^7$ (that is $10^6*7.5*5$ per stage) or $7.5*10^7$ (that is, $10^6*7.5*10$ per stage). Such a gain is, for example, used to detect weak chemiluminescence signals.

In accordance with the invention, a three-stage transimpedance amplifier can be used; three typical transimpedance amplifiers connected after one another and having a zero adjustment and having a filter therebetween (for example: a fast Fourier transformation filter, FFT filter) can therefore be used that are generally known to the skilled person with respect to their design (see e.g. Göbel, Holger "Einführung in die Halbleiter-Schaltungstechnik", Springer-Verlag, 2014).

Further advantageously implementable features can include the charge avalanche photodetector being configured in, and/or as, a first module; and the amplifier electronics configured in, and/or as, a second module, the first module and the second module preferably being arranged spatially separately from one another. Alternatively or in a addition, the charge avalanche photodetector can be embedded or arranged in, and/or at, a cooling element, in particular in, and/or at, a heat sink.

See also the following embodiment in this respect.

In accordance with the invention, the light signals to be measured can originate from functionalized bottoms of wells of a test strip in microtiter format. The spacing (of for example 10 mm) between the wells and a CAPD or SiPM in accordance with the invention can be bridged by a hollow, metallic waveguide. Such a hollow waveguide can be used to counteract a distance-dependent signal drop at said distance of, for example, 10 mm.

The present invention thus makes it possible to connect a CAPD, in particular an SiPN, to an AE electrically or electronically and to operate the CAPD at higher signals in a charge integration mode and at very low signals in the Geiger counter mode. The invention thus provides an inexpensive, universal detection module that enables measurements with almost any desired optical signal intensity (between single photon detections <10 photons per second up to $4*10^7$ photons per second or up to multiphoton detection in the range of several $mW/cm^2$). The total gain of the CAPDS or of the module can be changed stepwise, in particular on a software basis, between the Geiger counter mode and the charge integration mode. It is thus possible to carry out both absorbance measurements and chemiluminescence measurements at the bottom of a well of a microtiter plate. It is only necessary to change the microtiter plate, to switch of the voltage bias, and e.g. to change an amplification channel on a software basis between the two said measurement types.

The use of a number of optical measurement methods with variable intensity (dynamic range up to 10 decades) from single photon detection up to the milliwatt range is possible with the detection module in accordance with the invention. Additionally, this is possible in a comparatively inexpensive manner.

A major point of the invention is thus that a considerably larger range can already be detected solely by the operation with or without voltage bias. The measurement of chemiluminescence, absorption, and fluorescence is possible with a single detector in accordance with the invention. The light signals to be measured can originate from functionalized bottoms of two or three (or also of more than three) of the wells of e.g. a 1×8 test strip in microtiter format. Example: Absorption measurement in a liquid volume of 100 µl on excitation and measurement at a wavelength of $\lambda=650$ nm. Further example: Chemiluminescence measurement on the surface covered with liquid (100 µl) at a wavelength of $\lambda=460$ nm without excitation. An absorption measurement and a chemiluminescence measurement are thus possible in an integrated manner with a single detector.

The use of the charge avalanche photodetector system in accordance with the invention for photodetection is furthermore proposed, wherein the semiconductor photomultiplier is selectively operated (either) with a voltage bias $V_{bias}$ or without a voltage bias $V_{bias}$. The features described above in connection with the charge avalanche photodetector system can also use features of the use in accordance with the invention.

Figure 2:
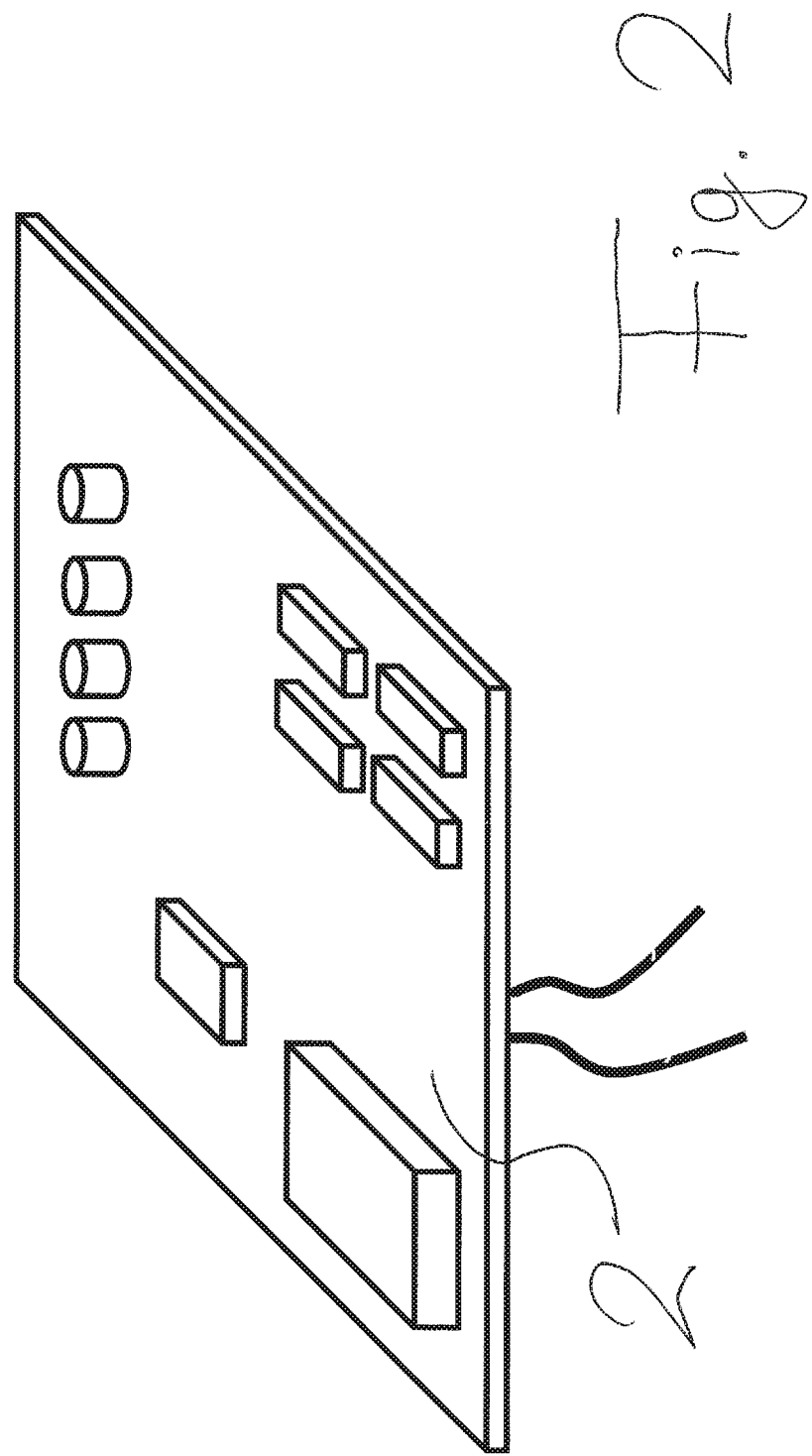
FIG. 2 illustrates the AE connected downstream of the module of FIG. 1.
Figure 3:
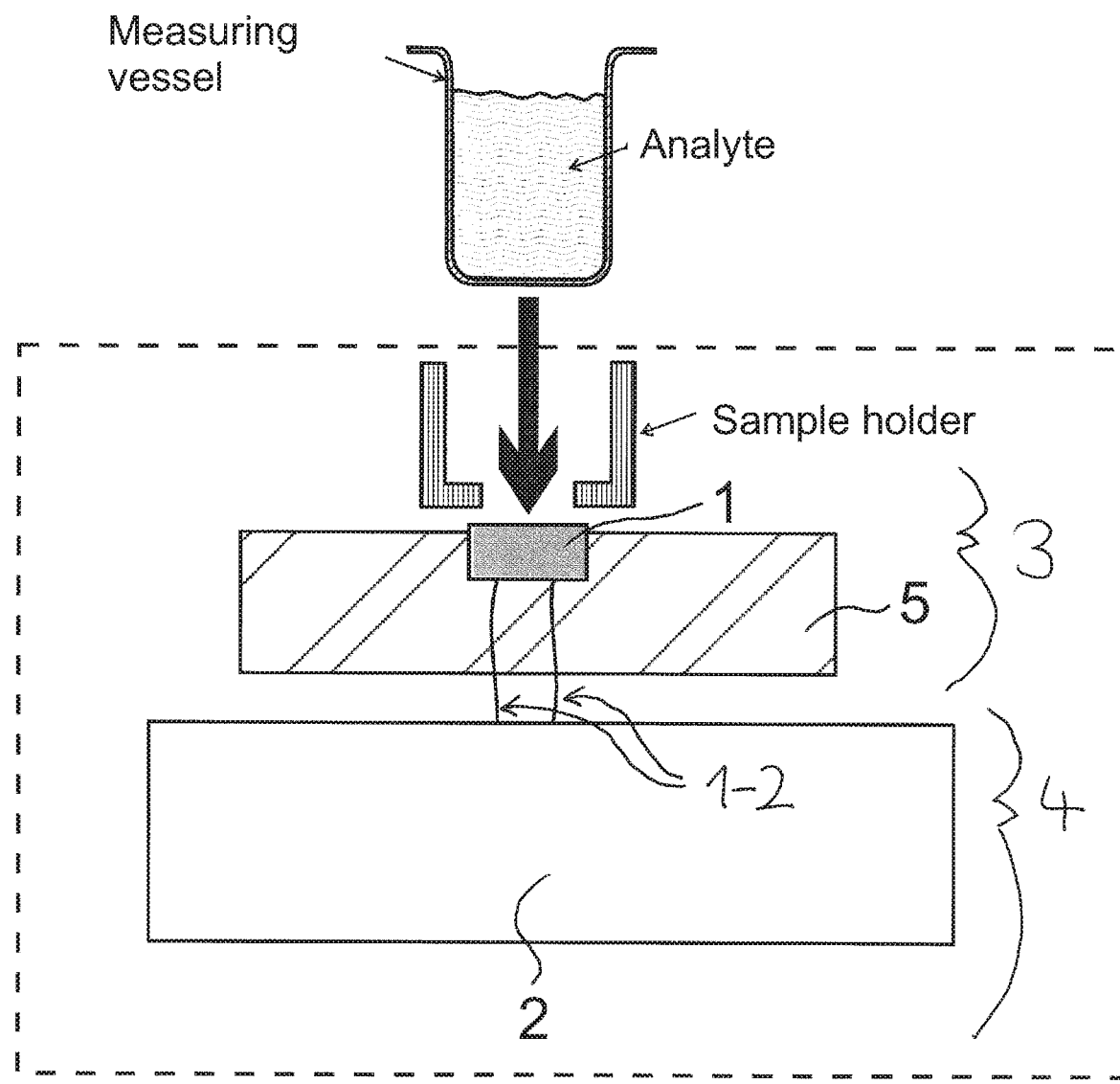
FIG. 3 is a schematic of the setup of the SiPM and the AE connected downstream.
Figure 4:
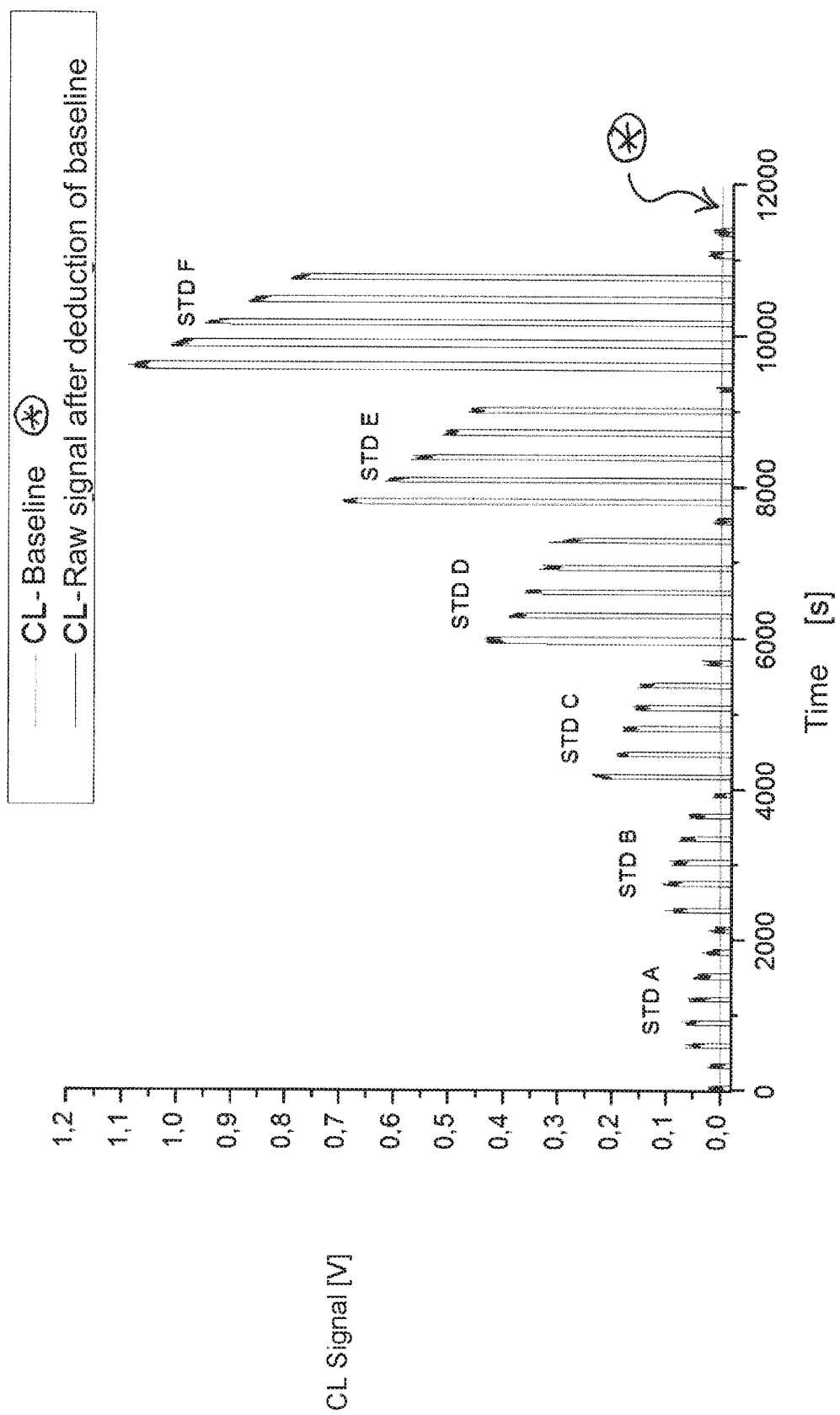
FIG. 4 shows an example of a chemiluminescence measurement.

Measurement results will be shown below by way of example with reference to a specific design. There are shown FIG. 1
an SiPM module in accordance with the invention for measurements of chemiluminescence and absorption;

FIG. 2
the AE connected downstream of the module of FIG. 1;

FIG. 3
the setup of the SiPM and the AE connected downstream;

FIG. 4
an example of a chemiluminescence measurement; and

Figure 5:
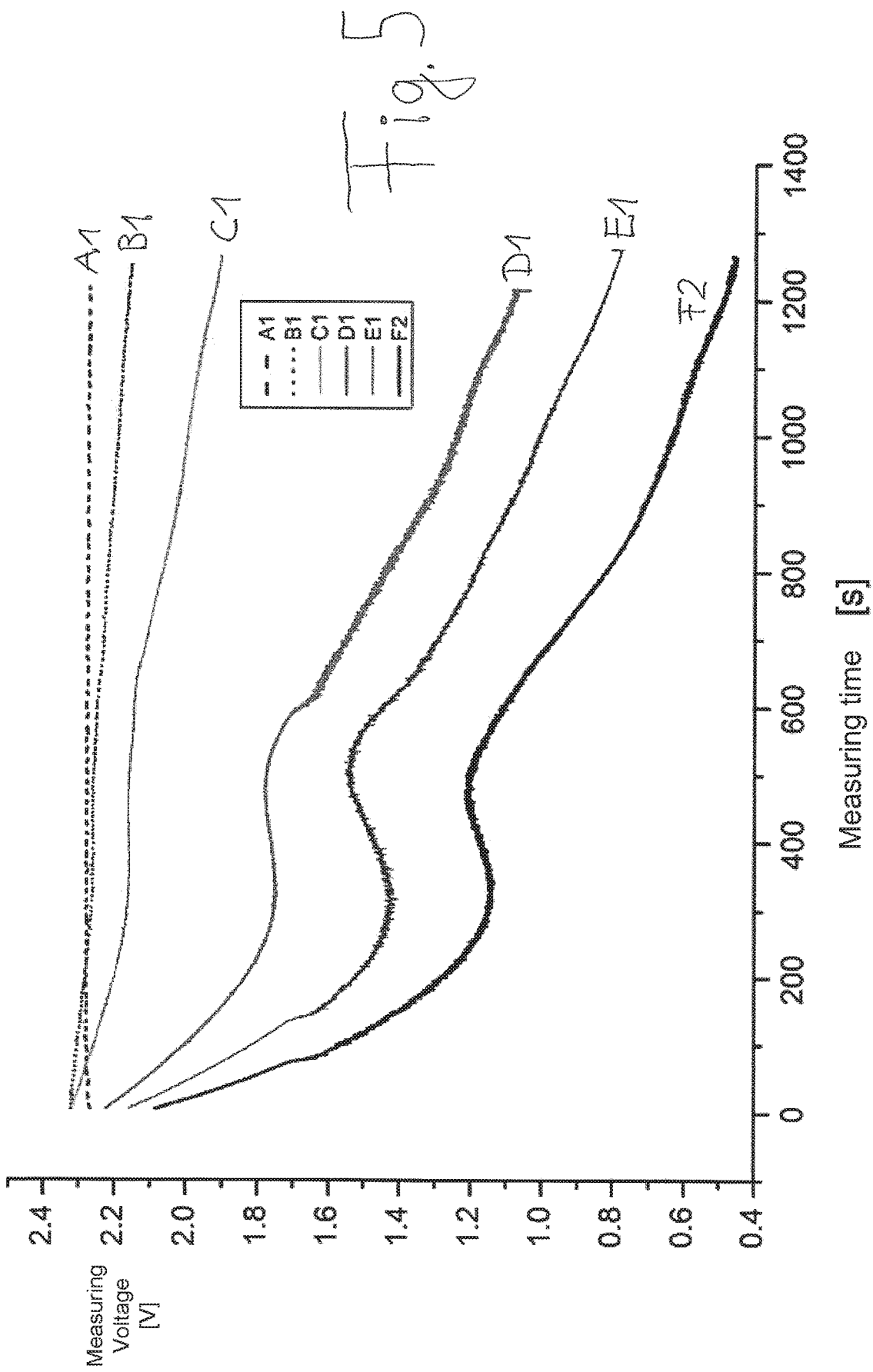
FIG. 5 shows an example of an absorption measurement.

FIG. 5
an example of an absorption measurement.

FIG. 1 shows the example module (SiPM module) 3 in accordance with the invention, cf. FIG. 3, having the SiPM 1 that is embedded in the center of a heat sink 5. Reference numeral 6 marks cooling ribs that are let into the heat sink 5 at both sides directly adjacent to the SiPM 1. FIG. 2 shows the amplifier electronics AE 2 that are connected downstream 1-2 of the SiPM 1 shown in FIG. 1 or of the corresponding SiPM module 3 (cf. FIG. 3). FIG. 3 shows the total setup of the SiPM module 3 having the SiPM 1 to which the AE module 4 having the AE 2 is electrically or electronically connected (via suitable cable connections) downstream. The two modules 3 and 4 are spatially spaced apart or separated from one another here so that the heat produced by the AE 2 or by the module 4 is kept away from the module 3 or the SiPM 1. The three-stage transimpedance amplifier of the AE can be recognized next to the AE (or to the SiPM control electronics) in FIG. 3.

The SiPM works in the avalanche mode with a pre-gain of approximately minus 28 volts. The three-stage transimpedance amplifier of the AE has a total gain of approximately $3.75*10^7$ (that is, $10^6*7.5*5$ per stage) necessary for measurements of the chemiluminescence. A corresponding measurement mode selection or circuit enables a measurement of the absorption with the first gain stage of $10^6$ (without a bias voltage). Since a chemiluminescence measurement requires a considerably higher sensitivity, the AE was adapted to the chemiluminescence measurement, with the option for an absorption measurement or for a fluorescence measurement (with a software-based change of the amplification or gain).

The spacing between the well and the SiPM amounts to 10 mm and is bridged by a hollow, metallic waveguide (e.g. a bore in the aluminum turntable).

A typical step sequence for the carrying out and the evaluation of a chemiluminescence measurement is as follows:
1. Placing the reference sample.
2. Setting of $V_{bias}$ (typically 28-30 V amount-wise).
3. Setting the background signal level (in the following: CL signal to −1.5 V).
4. Sampling the CL signal to check the starting voltage.
5. Setting $V_{bias}$ to 0.
6. Placing the sample.
7. Setting $V_{bias}$ to the previous value.
8. Sampling the CL signal (sampling rate 2 Hertz: 10 values within approximately 5 seconds).
9. Setting $V_{bias}$ to 0 V (volts).
10. A reference measurement can optionally be carried out again.

The example of FIG. 4 shows a result for such a chemiluminescence measurement. Features are as follows:
Signal deviation between Standard B and Standard E of up to 2 volts with an electronic-specific resolution of 0.01 volts.
The dynamic range of the SiPM can reach the value of 4.5 volts by zero adjustment to −2 volts.
The baseline was recorded at wells filled with luminol, but without incubation of the standard and the conjugate.
The luminol solution was a little weakened in this measurement.

A typical step sequence for the carrying out and the evaluation of an absorption measurement is as follows:
1. Setting $V_{bias}$ to 0 volts.
2. Setting the offset to 0 volts.
3. Placing the reference sample.
4. Sampling the absorption signal.
5. Placing the actual sample.
6. Sampling the absorption signal (sampling rate of 2 Hertz: 10 values within approximately 5 seconds).
7. Determining the absorption from the reference measurement, on the one hand, and from the sample measurement, on the other hand. A=−LOG ((Signal-$_{sample}$)/(reference signal determined at the start of the measurement)).

FIG. 5 shows the result of an exemplary absorption measurement (raw data). The following applies in this respect:
Excitation with an RGB LED ($\lambda$=565 nm).
The example measurements were recorded at 80% of the maximum LED power (35 mA).
Signal deviation up to 2 volts within 20 minutes.
Measurement during a color change reaction.
The dynamic range amounts to a maximum of 4.5 volts.
The signal peak at a measurement time of approximately 500 sec is caused by a diffusion-controlled color change reaction.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

The invention claimed is:

1. A charge avalanche photodetector (CAPD) system comprising:
a charge avalanche photodetector based on a charge avalanche principle; and
amplifier electronics electrically connected downstream of the charge avalanche photodetector and being suitable to post-amplify a signal of the charge avalanche photodetector,
wherein the charge avalanche photodetector is suitable to be selectively operable with a bias voltage $V_{bias}$ or without a bias voltage $V_{bias}$.

2. The CAPD system of claim 1 wherein the amplifier electronics are configured to cause a switchover from operation with the bias voltage $V_{bias}$ to operation without the bias voltage $V_{bias}$, or vice versa.

3. The CAPD system of claim 1 wherein the CAPD system is operable, both in operation of the charge avalanche photodetector with the bias voltage $V_{bias}$ and in operation of the charge avalanche photodetector without the bias voltage $V_{bias}$, selectively either with the amplifier electronics switched on or with the amplifier electronics switched off.

4. The CAPD system of claim 1 wherein the charge avalanche photodetector is switchable between a Geiger mode, a charge integration mode, and/or a mode of a PIN photodiode.

5. The CAPD system of claim 1, wherein the CAPD system is operable in the following measurement modes, wherein the CAPD system is switchable over from any one of the following measurement modes to any other one of the following measurement modes the CAPD system is switchable between respective directly adjacent measurement modes in accordance with the following order:
   Total gain mode 0: Operating the charge avalanche photodetector without a bias voltage $V_{bias}$ and with the amplifier electronics switched off,
   Total gain mode 1: Operating the charge avalanche photodetector without a bias voltage $V_{bias}$ and with the amplifier electronics switched on,
   Total gain mode 2: Operating the charge avalanche photodetector with a bias voltage $V_{bias}$ and with the amplifier electronics switched off, and
   Total gain mode 3: Operating the charge avalanche photodetector with a bias voltage $V_{bias}$ and with the amplifier electronics switched on.

6. The CAPD system of claim 1 wherein the charge avalanche photodetector is or comprises a silicon photomultiplier, SiPM.

7. The CAPD system of claim 1 wherein the amplifier electronics is a transimpedance amplifier.

8. The CAPD system of claim 1 wherein the charge avalanche photodetector is configured in, and/or as, a first module; and the amplifier electronics are configured in, and/or as, a second module.

9. The CAPD system of claim 1 wherein the charge avalanche photodetector is embedded or is arranged in, and/or at, a cooling element.

10. The CAPD system of claim 1, wherein the charge avalanche photodetector is a semiconductor photomultiplier or an avalanche photodiode.

11. The CAPD system of claim 2, wherein control electronics integrated in the amplifier electronics are configured to cause the switchover from operation with the bias voltage $V_{bias}$ to operation without the bias voltage $V_{bias}$, or vice versa.

12. The CAPD system of claim 1, wherein the amplifier electronics is a multi-stage transimpedance amplifier.

13. The CAPD system of claim 1, wherein the amplifier electronics is a three-stage transimpedance amplifier.

14. The CAPD system of claim 8, wherein the first module and the second module are arranged spatially separately from one another.

15. The CAPD system of claim 9, wherein the cooling element is a heat sink.

16. A method comprising: selectively operating a charge avalanche photodetector with a bias voltage $V_{bias}$ or without a bias voltage $V_{bias}$, wherein the avalanche photodector is based on a charge avalanche principle and amplifier electronics are electrically connected downstream of the charge avalanche photodetector, the amplifier electronics being suitable to post-amplify a signal of the charge avalanche photodetector.

* * * * *